(12) United States Patent
Kemmer et al.

(10) Patent No.: US 9,175,878 B2
(45) Date of Patent: Nov. 3, 2015

(54) SOLAR PANEL HOLDER

(71) Applicant: K2 Systems GmbH, Leonberg (DE)

(72) Inventors: David Kemmer, Stuttgart (DE);
Melanie Wiggers, Wiernsheim (DE);
Thomas Seeg, Ostfildern (DE)

(73) Assignee: K2 SYSTEMS GmbH, Leonberg (DE)

(*) Notice: Subject to any disclaimer, the term of this patent is extended or adjusted under 35 U.S.C. 154(b) by 53 days.

(21) Appl. No.: 13/890,627

(22) Filed: May 9, 2013

(65) Prior Publication Data
US 2013/0299656 A1 Nov. 14, 2013

(30) Foreign Application Priority Data

May 9, 2012 (DE) .......................... 10 2012 009 486

(51) Int. Cl.
*F24J 2/52* (2006.01)
*H02S 20/23* (2014.01)
*H01L 31/042* (2014.01)

(52) U.S. Cl.
CPC .............. *F24J 2/5245* (2013.01); *F24J 2/5207* (2013.01); *F24J 2/5258* (2013.01); *H02S 20/23* (2014.12); *H01L 31/042* (2013.01); *Y02B 10/20* (2013.01); *Y02E 10/47* (2013.01)

(58) Field of Classification Search
CPC ....... H01L 31/042; H02S 20/23; E04D 13/18; F24J 2/5245; F24J 2/5252; F24J 2/5258
USPC .............. 248/237, 316.4, 309.1, 229.24, 500; 136/244, 251; 52/173.3, 460, 489.1; 411/107, 190
See application file for complete search history.

(56) References Cited

U.S. PATENT DOCUMENTS

| | | | |
|---|---|---|---|
| 8,181,926 B2 * | 5/2012 | Magno et al. ................. 248/237 |
| 8,403,281 B2 * | 3/2013 | Burtscher et al. ......... 248/229.24 |
| 2008/0053517 A1 * | 3/2008 | Plaisted et al. ................ 136/251 |
| 2009/0019796 A1 * | 1/2009 | Liebendorfer ............... 52/173.3 |
| 2010/0275975 A1 * | 11/2010 | Monschke et al. ............ 136/251 |
| 2011/0260027 A1 * | 10/2011 | Farnham, Jr. .............. 248/309.1 |
| 2012/0192399 A1 * | 8/2012 | Dinh .......................... 248/316.4 |
| 2013/0125492 A1 * | 5/2013 | Molek et al. ................. 52/489.1 |
| 2013/0200245 A1 * | 8/2013 | Markiewicz et al. ......... 248/500 |

* cited by examiner

*Primary Examiner* — Tan Le
(74) *Attorney, Agent, or Firm* — Harness, Dickey & Pierce, P.L.C.

(57) ABSTRACT

A solar module retention unit for clamping retention of a solar module has a base retention unit that is attachable at the mounting site, an intermediate element, and a clamping element, a clamping surface for the clamping element, with a counter-clamping surface of the base retention unit, forming a retention clip for the solar module, and the intermediate element being held on the base retention unit, displaceable transverse to the clamping direction of the retention clip, and the clamping element being mechanically linked to the intermediate element by a screw connection having a rotational axis. The clamping element is guided on the intermediate element rotation-fast by an anti-rotation element with respect to the rotational axis of the screw connection.

24 Claims, 7 Drawing Sheets

SOLAR PANEL HOLDER

CROSS-REFERENCE TO RELATED APPLICATIONS

This application claims the benefit and priority of German Application No. 10 2012 009 486.8 filed 9 May 2012. The entire disclosure of the above application is incorporated herein by reference.

FIELD

The present disclosure relates to a solar module retention unit for clamping retention of a solar module.

DISCUSSION

This section provides a general summary of the disclosure, and is not a comprehensive disclosure of its full scope or all of its features.

The invention relates to a solar module retention unit for clamping retention of a solar module, which solar module retention unit has a base retention unit that is attachable at the mounting site, an intermediate element, and a clamping element, a clamping surface for the clamping element, with a counter-clamping surface of the base retention unit, forming a retention clip for the solar module, and the intermediate element being held on the base retention unit, displaceable transverse to the clamping direction of the retention clip, and the clamping element being mechanically linked to the intermediate element by means of a screw connection having a rotational axis.

A solar module retention unit of the aforesaid type is known for instance from DE 10 2009 008 683 A1 and is used to clamp a solar module to a roof. The solar module retention unit has a rail that is attached to the roof and in which an axially displaceable slot nut is borne. In addition, the solar module retention unit has a step-like holding sheet metal that is provided with a hole so that the holding sheet metal may be attached to the slot nut by means of a screw. During mounting of the solar module, the solar module is first positioned and aligned on the rail. Then the slot nut and the holding sheet metal attached to it are displaced and the holding sheet metal is manually aligned such that the holding sheet metal wraps around a frame of the solar module by area. Tightening the screw then causes the solar module to be clamped between the rail and the holding sheet metal, thus securely attached to the roof. Since the known solar module retention unit constitutes a plurality of individual parts, especially the slot nut, the holding sheet metal, and the screw, mounting may be rendered more difficult depending on the conditions on the roof.

It is therefore the object of the invention to create a solar module retention unit that is distinguished by simple design and at the same time permits simple and secure mounting of a solar module.

This object is inventively attained in that the clamping element is guided on the intermediate element rotation-fast by means of an anti-rotation element with respect to the rotational axis of the screw connection. Thus the anti-rotation element counteracts twisting of the clamping element relative to the intermediate element even when the screw connection is tightened or loosened. The clamping element is also prevented from turning with respect to the intermediate element when a screw of the screw connection is tightened. This ensures that the relative position of the clamping element and the intermediate element to one another does not change with respect to the rotational axis when the solar module is mounted at the mounting site, especially on a roof. A person who is assembling the unit at the mounting site thus does not have to pay attention that the clamping element and the intermediate element assume specific positions relative to one another in order to clamp the solar module to be mounted between the clamping surface of the clamping element and the counter-clamping surface of the base retention unit. On the contrary, due to the anti-rotation element, this is automatically assured so that during the mounting process the person does not have to pay attention to this because incorrect positioning between clamping element and intermediate element is avoided. The clamping element is also guided on the intermediate element in the axial direction, that is, along the rotational axis. Thus it is possible to displace the clamping element on the intermediate element along the axis of rotation, but it is not possible to rotate the clamping element about the rotational axis when the clamping element is guided on the intermediate element.

According to one refinement of the invention, it is provided that the clamping element has at least one guide wall that is displaceably guided in the direction of the rotational axis along an area of the outer sectional contour of the intermediate element. The at least one guide wall thus may be moved in the direction of the rotational axis along the area of the outer sectional contour of the intermediate element. The clamping element is prevented from rotating about the rotational axis because the intermediate element embodies a stop for the guide wall and thus prevents the clamping element from rotating.

It is preferably provided that the clamping element has two parallel guide walls between which a section of the intermediate element is received and guided. The clamping element thus wraps around the section of the intermediate element. If there is now an attempt to rotate about the rotational axis the clamping element that is guided on the intermediate element, the section acts as a stop for both guide walls.

It is advantageous when the outer sectional contour of the section of the intermediate element and/or an extension of the section is square. Due to this embodiment, the clamping element may be guided, especially with two parallel guide walls, in directions rotated 90° to one another on the intermediate element, especially on the section of the intermediate element. Due to this symmetrical embodiment of the section of the intermediate element, a base retention unit that is attached to a particularly steep roof, for instance, may be used both to clamp a solar module to a lateral side and also to retain a solar module at its top or bottom. This therefore enables versatile use of the solar module retention unit, the use being determined by the conditions at the mounting site and the desired arrangement of the solar module(s). The same is true of the extension of the section, which extension cooperates with the base retention unit.

In accordance with one refinement of the invention, it is provided that the intermediate element has a longitudinal channel in which a threaded screw belonging to a screw connection engages. The threaded screw that defines the rotational axis thus mechanically links the clamping element to the intermediate element.

It is advantageously provided that the longitudinal channel is embodied as a screw channel for the threaded screw or that a nut for the threaded screw is inserted into the longitudinal channel. The screw channel forms a female thread into which the threaded screw may be screwed. Alternatively, inserted into the longitudinal channel is a nut or a nut-like element that has an opening with a female thread, and the threaded screw may be screwed into it. The so-called screw connection is embodied by the threaded screw and the screw channel or the nut. The longitudinal channel is preferably a channel in the intermediate element that is accessible from at least one side of the intermediate element, especially from two opposing sides of the intermediate element, so that insertion of the nut is facilitated. "Screw channel" shall be construed to mean a channel on whose preferably flat channel walls are embodied thread contours that cooperate with the thread of the threaded screw.

In one preferred refinement of the invention it is provided that at least one supporting projection for axially fixing the nut is provided in the longitudinal channel. Preferably two supporting projections are embodied in the longitudinal channel on opposing inner sides of the intermediate element. The nut is fixed in the longitudinal channel, in an axially non-displaceable manner or in a manner such that its axial displacement is limited, by the at least one supporting projection.

It is preferably provided that the nut is received in the longitudinal channel in an anti-rotational manner. The outer sectional contour of the nut and the inner sectional contour of the longitudinal channel are consequently matched to one another such that the nut is prevented from rotating about the rotational axis. At least one inner side of the longitudinal channel preferably forms a stop for the nut. This embodiment advantageously ensures that when a solar module is being mounted, the nut does not rotate when the screw is being tightened. This significantly simplifies mounting of the solar module at the mounting site, especially on a roof.

It is preferably provided that the guide walls for the clamping element are joined to one another by means of a transverse bar. The transverse bar preferably connects the two parallel guide walls of the clamping element so that the clamping element overall has an H-shaped longitudinal cross-section.

It is especially provided that the threaded screw passes through an opening in the transverse bar and is supported with a screw head on the transverse bar for applying a clamping force of the retention clip. The opening of the transverse bar is flush with the longitudinal channel of the intermediate element so that the threaded shaft of the threaded screw that passes through the opening may be screwed into the screw channel or into the nut arranged in the longitudinal channel and the screw head of the threaded screw is supported on the transverse bar. Tightening the threaded screw guides/displaces the clamping element on the intermediate element along the rotational axis, so that the distance between the clamping surface of the clamping element and the counter-clamping surface of the base retention unit that is or may be arranged fixed at the mounting site decreases. This exerts the aforesaid clamping force on the solar module, which is arranged between the clamping surface and the counter-clamping surface, and clamps the solar module overall between the clamping element and the base retention unit.

In accordance with one refinement of the invention it is provided that the intermediate element is held on the base retention unit by means of a slot nut connection. The slot nut connection has a slot nut and a receiving element, the slot nut being provided on the intermediate element and the receiving element being provided on the base retention unit, and they cooperate such that the intermediate element is displaceably held by displacing the slot nut in the receiving element on the base retention unit.

It is especially provided that the intermediate element has the slot nut that is inserted in the receiving element of the base retention unit and, when the clamping force of the retention clip is applied, is non-displaceably supported on a receiving surface of the receiving element of the base retention unit. Simply inserting the slot nut of the intermediate element into the receiving element of the base retention unit therefore releasably and displaceably holds the intermediate element on the base retention unit. If a clamping force is applied, that is, if the threaded screw is tightened, i.e. screwed into the screw channel or nut, the slot nut is pressed against a receiving surface limiting the receiving element and thus is supported on this receiving surface so that overall the slot nut is clamped in the receiving element such that it cannot be displaced. In other words, the intermediate element is wedged in on the base retention unit so that the intermediate element and the base retention unit are arranged immovable with respect to one another. Thus using the screw connection the clamping force is produced that acts on the solar module and by means of which at least one solar module is held on the solar module retention unit and also the intermediate element of the solar module retention unit is fixed relative to the base retention unit of the solar module retention unit so that the solar module is attached location-fast to the mounting site, especially the roof. Due to this embodiment, advantageously no additional measures are necessary to fix the displaceable connection of the intermediate element to the base retention unit.

It is preferably provided that the base retention unit has a base plate on which are provided two parallel walls that extend perpendicular to the plane of the base plate and between which the receiving element is embodied by means of a longitudinal projection embodied on at least one of the walls. The base plate of the base retention unit is preferably attached to the mounting site, especially to the roof. The two parallel walls preferably extend at a right angle to the base plate. The receiving element is limited by an area of the base plate, one area of the walls, and the at least one longitudinal projection that is embodied on at least one of the two walls. A longitudinal projection is preferably embodied on each of the two walls, the longitudinal projections opposing one another. Due to this embodiment, the longitudinal cross-section of the receiving element is a C profile. The base retention unit is preferably overall embodied symmetrical and rail-like. The at least one longitudinal projection preferably forms the aforesaid receiving surface, against which the slot nut of the intermediate element is supported when a clamping force is applied to the retention clip.

It is preferably provided that the extension of the section of the intermediate element guides and extends towards the longitudinal projection to between the walls of the base retention unit. The extension of the section of the intermediate element, which section preferably has a square outer sectional contour, projects between the two walls of the base retention unit. If the intermediate element is displaced with respect to the base retention unit, the walls of the base retention unit then act as a guide for the extension of the section of the intermediate element. This advantageously increases the mechanical strength of the solar module retention unit and prevents the intermediate element from becoming wedged in if it is displaced thereby.

In one refinement of the invention it is provided that the slot nut is connected to the extension of the section via a holding rib that forms a neck of the intermediate element, the longitudinal projection delimiting the neck. The neck of the intermediate element has a smaller cross-section than the extension and the slot nut of the intermediate element. In particular the section, extension, and slot nut have an identical outer sectional contour, especially a square outer sectional contour. The at least one longitudinal projection of the base retention unit is adjacent to the neck of the intermediate element, which creates a guide. In other words, the longitudinal projection provided on the at least one wall of the base retention unit engages in a receiving groove of the intermediate element that is embodied by the extension, the neck, and the slot nut of the intermediate element.

In one refinement of the invention it is provided that a clamping bar that has the clamping surface projects away from the guide wall of the intermediate element and that a counter-clamping bar having the counter-clamping surface projects away from at least one of the walls of the base retention unit. The counter-clamping bar preferably extends across the entire longitudinal extension of the base retention unit. The counter-clamping bar acts as a support for an edge area, especially a frame, of the solar module. Tightening the screw connection causes the clamping surface of the clamping bar to press against an area of the solar module, especially the frame, that faces away from the mounting site, especially the roof, so that the solar module is clamped and therefore securely held between the clamping bar and the counter-clamping bar. The clamping bar and the counter-clamping bar preferably are essentially parallel. A counter-clamping bar preferably projects away from each of the two walls of the base retention unit. In particular the counter-clamping bar forms a right angle with each of the walls. In addition, the intermediate element preferably has two guide walls, each with a clamping bar, so that overall the clamping element and the base retention unit are symmetrical and two solar modules that are vertically or horizontally adjacent to one another may be held by means of such a solar module retention unit.

It is furthermore advantages when the intermediate element, the clamping element, and/or the base retention unit is/are embodied as (an) extruded component(s). The female thread of the screw channel is preferably also produced during the extrusion. Female thread shall be construed to mean teeth on the inside of the longitudinal channel, the longitudinal channel due to the extrusion and the subsequent cutting process for separating individual intermediate elements being an open channel that is embodied open on two opposing sides. The female thread embodied by the screw channel then does not surround the screw engaging therein around its circumference, but rather is tangent thereto only on two sides. The extrusion permits a simple and cost-effective manufacturing process for the aforesaid components.

DRAWINGS

The drawings described herein are for illustrative purposes only of selected embodiments and not all possible implementations, and are not intended to limit the scope of the present disclosure.

The drawings illustrate the invention using exemplary embodiments:

Corresponding reference numerals indicate corresponding parts throughout the several views of the drawings.

DETAILED DESCRIPTION

Example embodiments will now be described more fully with reference to the accompanying drawings.

Figure 1:
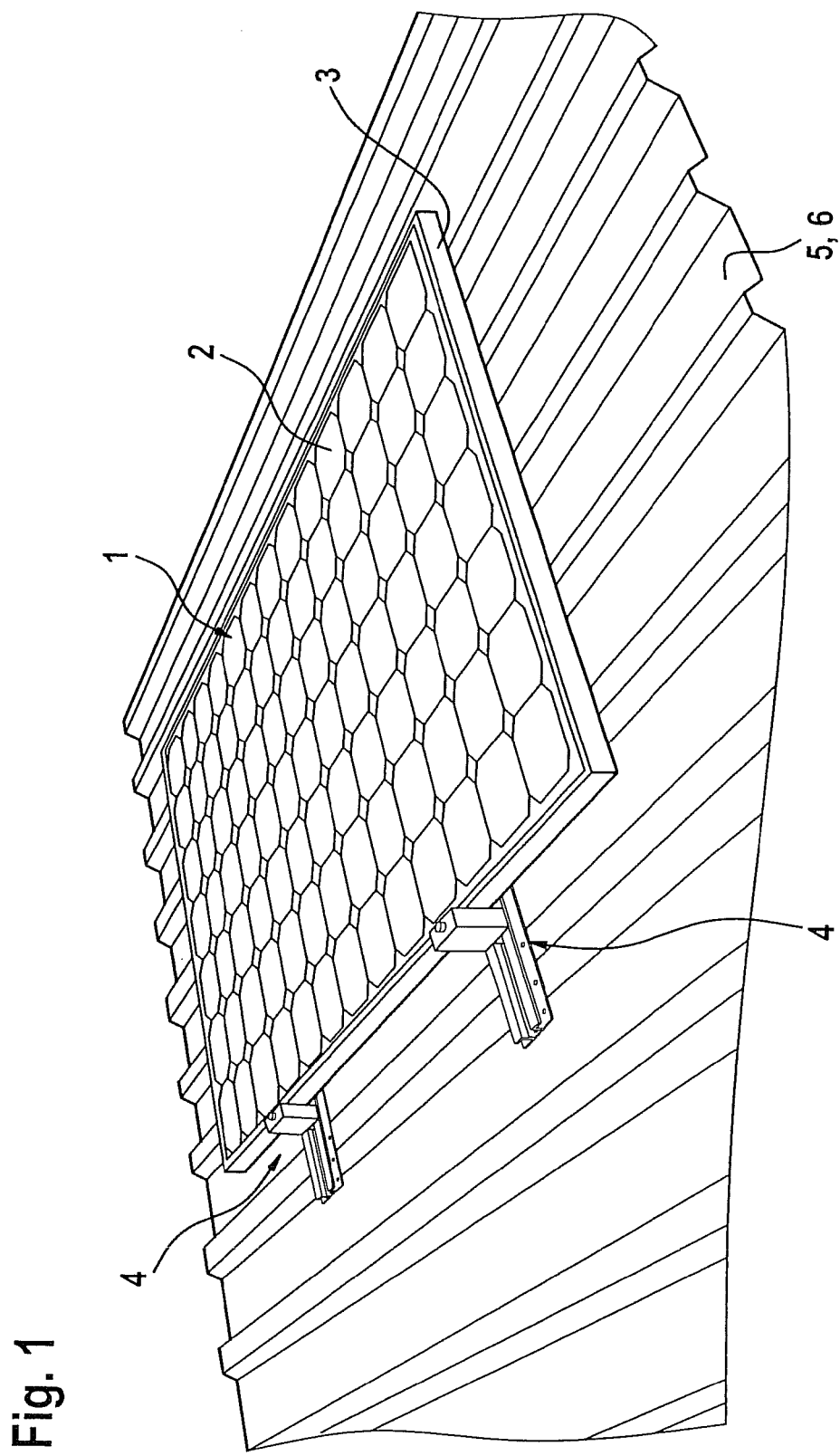
FIG. 1 depicts a solar module attached to a roof by means of solar module retention units.

FIG. 1 depicts a solar module 1, the solar cells 2, and a frame 3 surrounding the solar cells 2. The solar module 1 is attached to a roof 5, especially a trapezoidal sheet metal roof 6, by means of two solar module retention units 4. The solar module retention units 4 are only shown schematically in FIG. 1. The solar module retention units 4 shall be discussed in detail in the following.

Figure 2:
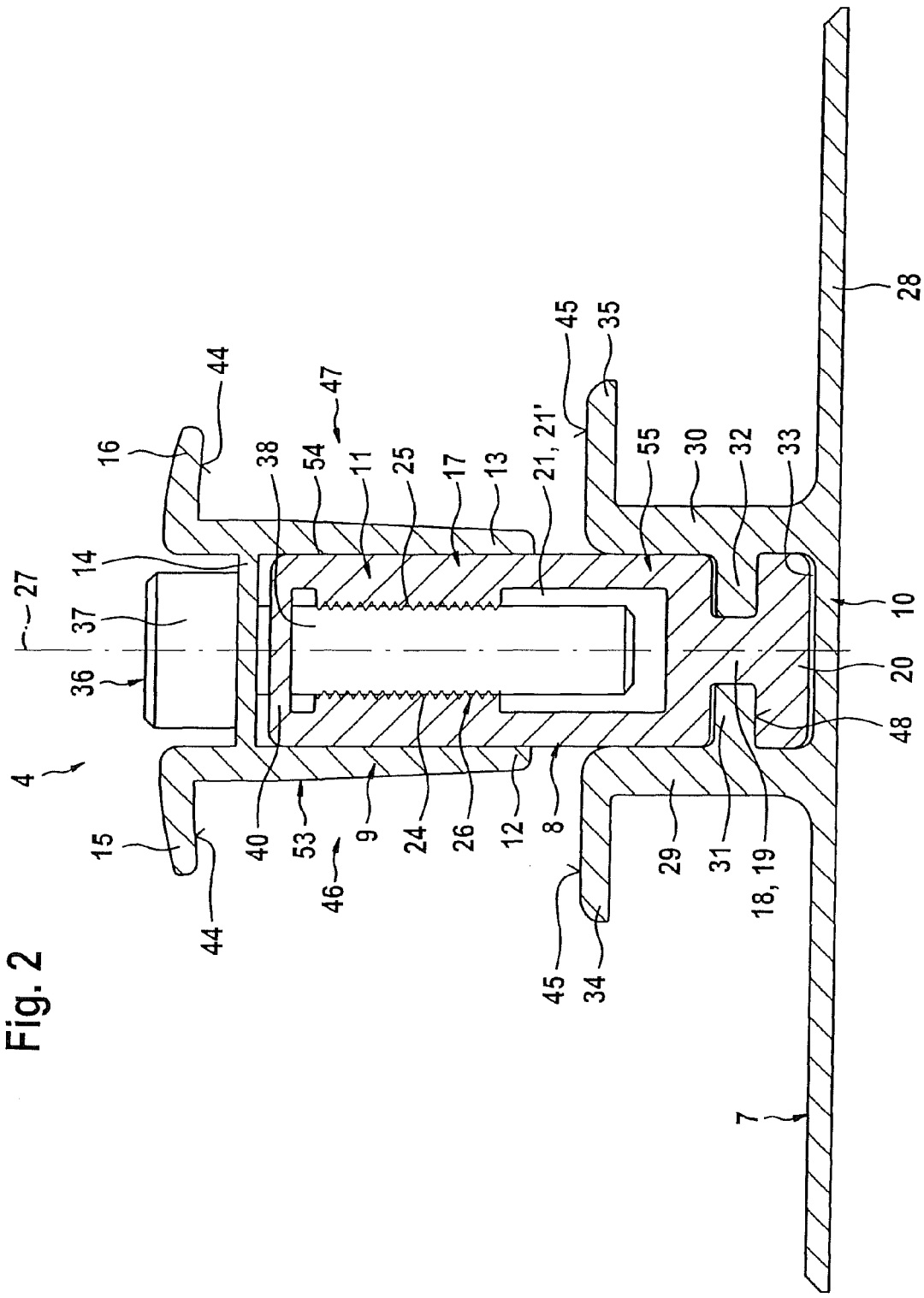
FIG. 2 is a sectional view of the solar module retention unit in accordance with a first exemplary embodiment.
Figure 3:
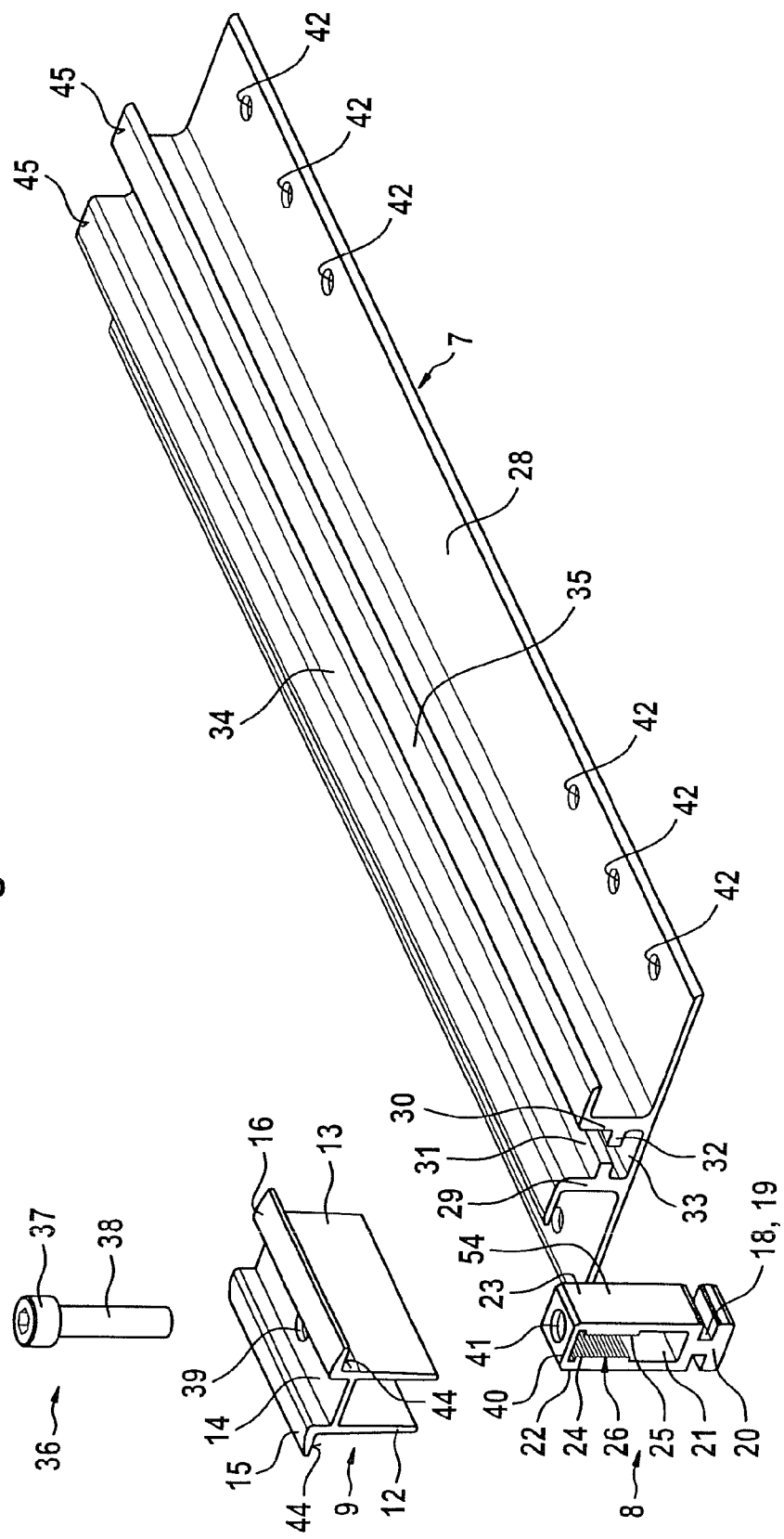
FIG. 3 is an exploded rendering of the solar module retention unit in accordance with FIG. 2.

FIGS. 2 and 3 depict a solar module retention unit 4 in accordance with a first exemplary embodiment, FIG. 2 depicting a longitudinal section and FIG. 3 being an exploded rendering of the solar module retention unit 4. The solar module retention unit 4 has a base retention unit 7, an intermediate element 8, and a clamping element 9. The base retention unit 7, the intermediate element 8, and the clamping element 9 are preferably each embodied as extruded components. The intermediate element 8 is connected to the base retention unit 7 by means of a slot nut connection 10. The clamping element 9 is guided on the intermediate element 8 and by means of a screw connection 11 is mechanically linked to the intermediate element 8.

The clamping element 9 has two guide walls 12, 13 that run parallel to one another and that are connected to one another by means of a transverse bar 14. The guide walls 12, 13 and the transverse bar 14 form an H-shape in the longitudinal section of the solar module retention unit 4 in accordance with FIG. 2. The clamping element 9 also has two clamping bars 15, 16 that each project away from one of the guide walls 12, 13 in opposing directions. With the respective guide walls 12, 13 they form an angle of approximately 90°. The clamps 15, 16 wrap around the frame 3 of the solar module 1 when the solar module 1 is mounted to the roof 5 and thus produce a clamping force that acts on the frame 3 towards the roof 5.

The intermediate element 8 of the solar module retention unit 4 has a section 17 having a square outer sectional contour 54, an extension 55 connecting to the section 17, a holding rib 19 forming a neck 18 connected thereto, and a slot nut 20 connected to the holding rib 19. The slot nut 20 has the same square outer sectional contour 54 as the section 17 and the extension 55. A longitudinal channel 21 is embodied in the section 17 and in the extension 55 of the intermediate element 8. Since the intermediate element 8 is an extruded component, two sides of the square outer sectional contour 54 of the section 17 and of the extension 55 are embodied open and in accordance with FIG. 2 the longitudinal cross-section of the longitudinal channel 21 is essentially rectangular in shape. The longitudinal channel 21 is embodied as a screw channel 21', that is, it has teeth 24, 25 on the inside of each of its parallel intermediate element walls 22, 23, the teeth 24, 25 forming a female thread 26 that embodies a screw connection 11 defining a rotational axis 27.

The base retention unit 7 of the solar module retention unit 4 has a base plate 28. Two parallel walls 29, 30 are provided on the base plate 28 and extend away therefrom at a right angle. The distance between the walls 29, 30 is approximately or somewhat greater than one side of the square outer sectional shape 54 of the section 17 or the extension 55 or the slot nut 20 of the intermediate element 8. One longitudinal projection 31, 32 is embodied on each opposing wall 29, 30 of the base retention unit 7. The longitudinal projections 31, 32, one area of each of the walls 29, 30 and one area of the base retention plate 28 define a receiving element 33 of the base retention unit 7 into which the slot nut 20 of the intermediate element 8 may be inserted. The receiving element 33 is embodied as a C-shaped receiving element 33. Furthermore, one counter-clamping bar 34, 35 is provided on each of the walls 29, 30. The counter-clamping bars 34, 35 project from the walls 29, 30 at right angles in opposing directions.

The solar module retention unit 4 furthermore has a threaded screw 36 that is part of the screw connection 11. The threaded screw 36 has a screw head 37 and a shaft 38 that is provided with a thread. When the solar module retention unit 4 is mounted (FIG. 2), the shaft 38 passes through an opening 39 provided in the transverse bar 14 of the clamping element 9 and an opening 41 provided in one end face 40 of the intermediate element 8 that provides access to the screw channel 21' of the intermediate element 8. The thread of the shaft 38 may be screwed into the female thread 26 embodied by the screw channel 21'. The diameter of the opening 41 in the end face 40 of the intermediate element 8 is only slightly larger than the shaft 38 of the threaded screw 36 so that the threaded screw 37 is guided there.

Provided at intervals in the base plate 28 of the base retention unit 7 on both sides of the walls 29, 30, are a plurality of through-holes 42 that are used to attach the base retention unit 7, for instance, to the roof 5 by means of screws (not shown). The base retention unit 7 preferably is 350 to 450 mm long, especially about 400 mm long. With these holes the base retention unit 7 may thus be attached to any trapezoidal sheet metal roof with ledge spacing of up to 375 mm.

Figure 6:
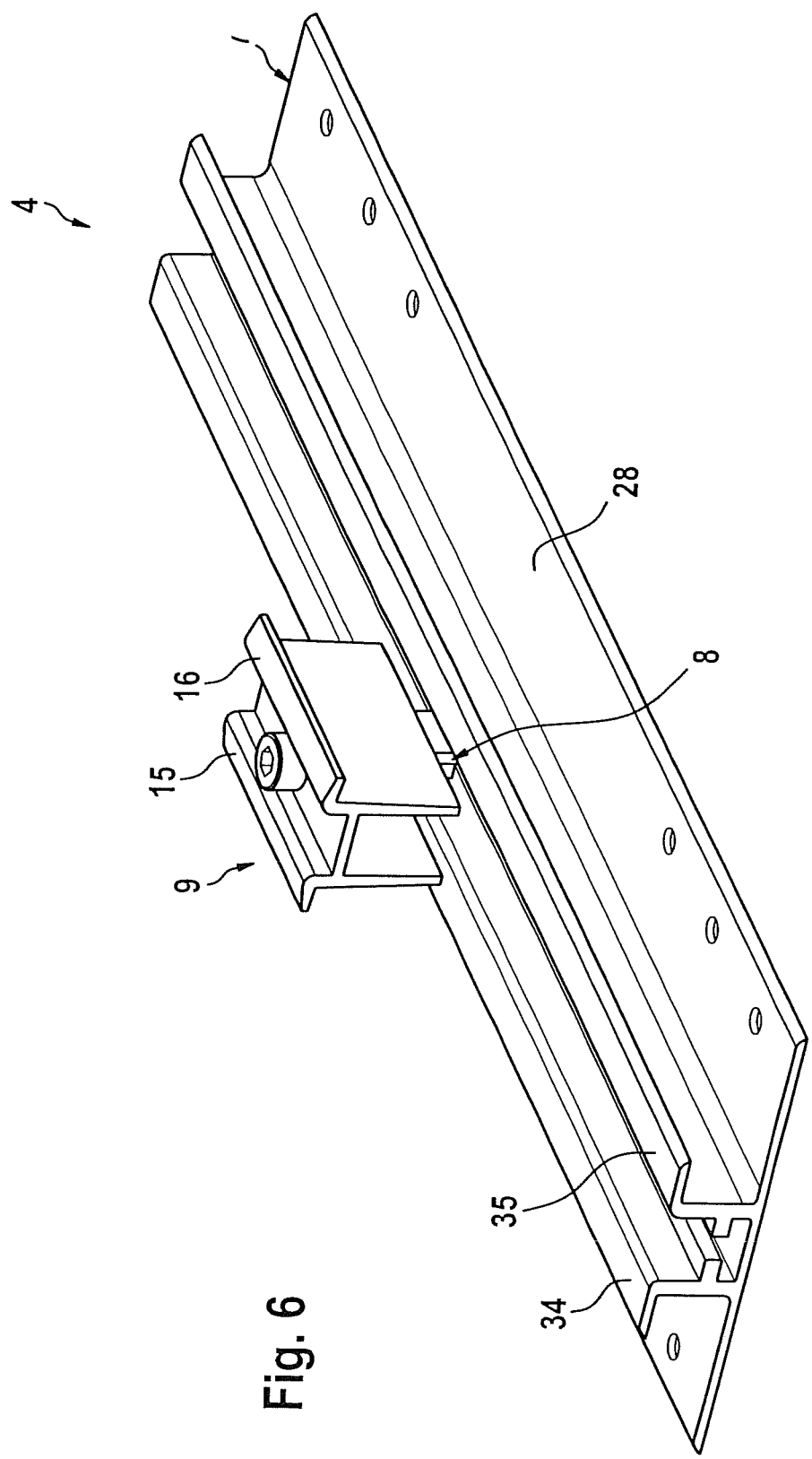
FIG. 6 is a perspective elevation of the solar module retention unit in a first position; and, FIG. 7 is a perspective elevation of the solar module retention unit in FIG. 6 in a second position.
Figure 7:
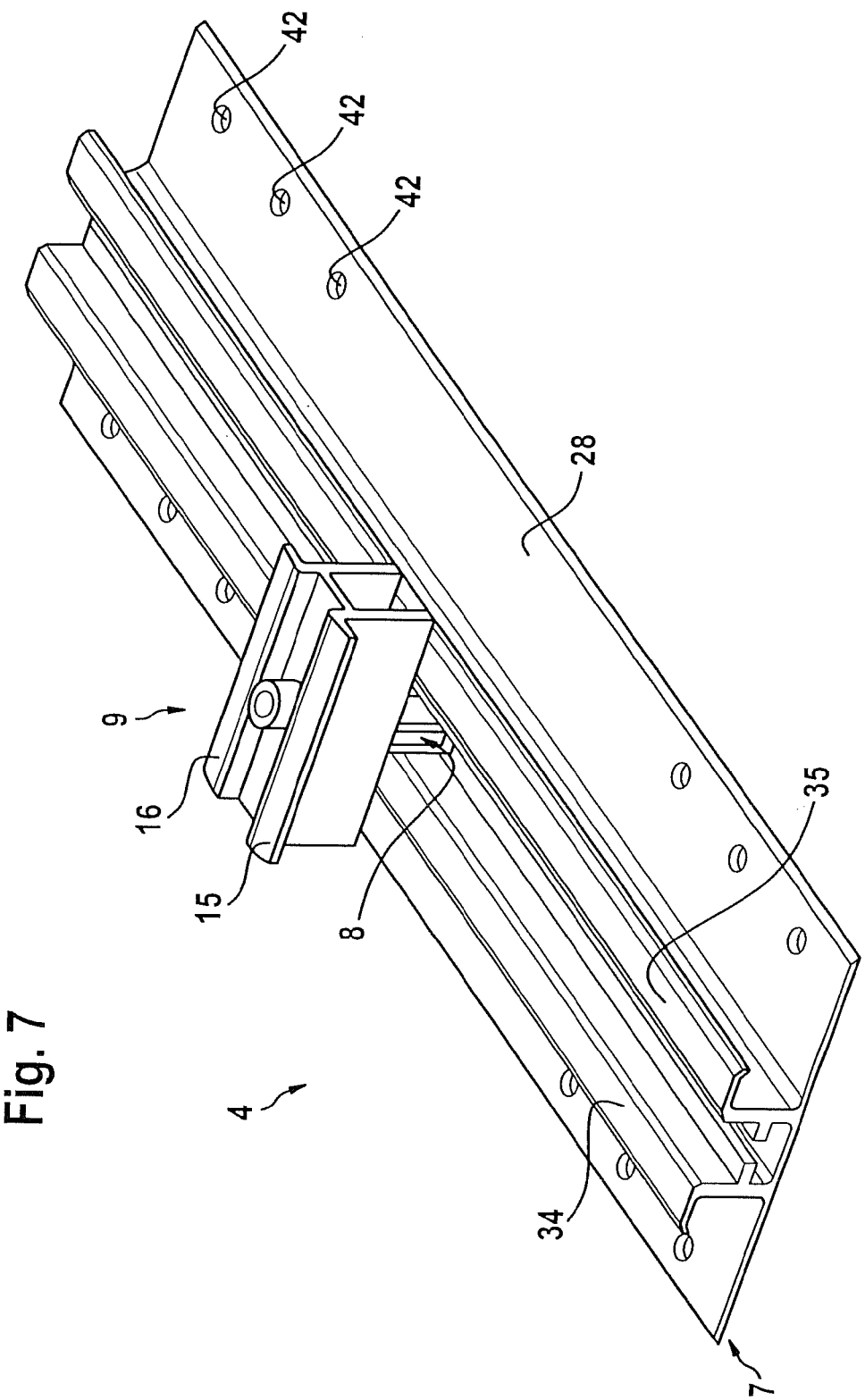

The functioning of the solar module retention unit 4 is described in the following: For attaching the solar module 1 to the roof 5, especially a trapezoidal sheet metal roof 6, the base retention unit 7 is attached to the roof 5. Then the slot nut 20 of the intermediate element 8 is used to insert a pre-assembled unit constituting the intermediate element 8 and clamping element 9 into the receiving element 33 of the base retention unit 7. The guide walls 12, 13 of the clamping element 9 are pushed onto the section 17 of the intermediate element 8, which section has a square cross-section, and the clamping element 9 therefore is held rotation-fast by means of an anti-rotation element 53 formed in this manner. Due to the square design of the section 17 of the intermediate element 8 and the parallel guide walls 12, 13 of the clamping element 9, the clamping element 9 may be placed on the intermediate element 8 in exactly two different positions, which are illustrated in FIGS. 6 and 7 and differ by 90°. In addition, or alternatively, it is also possible for the slot nut 20 to be inserted into the receiving element 33 in two positions that differ by 90° (FIGS. 6 and 7). The shaft 38 of the pre-assembled threaded screw 36 is guided through the openings 39 and 41 and screwed into the female thread 26 of the screw channel 21' by area. Naturally the solar module retention unit 4 may also be constructed during mounting on the roof 5 by putting together its individual parts; however, this is often difficult at the mounting site. In the next step, the solar module 1, especially its frame 3, is positioned as desired on one of the counter-clamping bars 34, 35 of the base retention unit 7. Then the intermediate element 8 with the clamping element 9 loosely attached thereto is displaced along the base retention unit 7 until the one clamping bar 15, 16 of the clamping element 9 overlaps an area of the solar module 1 or its frame 3. Now the threaded screw 36 is screwed further into the female thread 26 of the screw channel 21'. The anti-rotation element 53 is embodied by the section 17 of the intermediate element 8 and the two guide walls 12, 13 of the clamping element 9, and it ensures the alignment of the parts and prevents the tightening of the threaded screw 6 from causing the clamping element 9 to rotate, as well. Thus it is not necessary for a person to fix the clamping element 9 manually when the threaded screw is tightened 36. Tightening the threaded screw 36 causes the clamping bar 15, 16 to be pressed onto the solar module 1 or its frame 3 and thus a clamping force that acts on the solar module 1 is produced by means of which force the solar module 1 is held securely between the base retention unit 7 and the clamping element 9. For this, the clamping bar 15, 16 has a clamping surface 44 positioned from above onto the solar module 1 and the counter-clamping bar 34, 35 has a counter-clamping surface 45 that is positioned against the solar module 1 from below. The clamping surface 44 and the counter-clamping surface 45 for the clamping bar 15, 16 or the counter-clamping bar 34, 35 thus form a retention clip 46. The clamping force acts on the solar module 1 towards the rotational axis 27. By tightening the threaded screw 36 and due to the clamping force acting on the solar module 1 that this produces, at the same time the slot nut 20 is pressed against the longitudinal projections 31, 32 that have a receiving surface 48, that is, towards the rotational axis 27, which prevents the slot nut 20 from moving in the receiving element 33, especially at a right angle to the rotational axis 27, and thus the slot nut 20 and therefore the intermediate element 8 are non-displaceably fixed in the receiving element 33 on the base retention unit 7.

Figure 4:
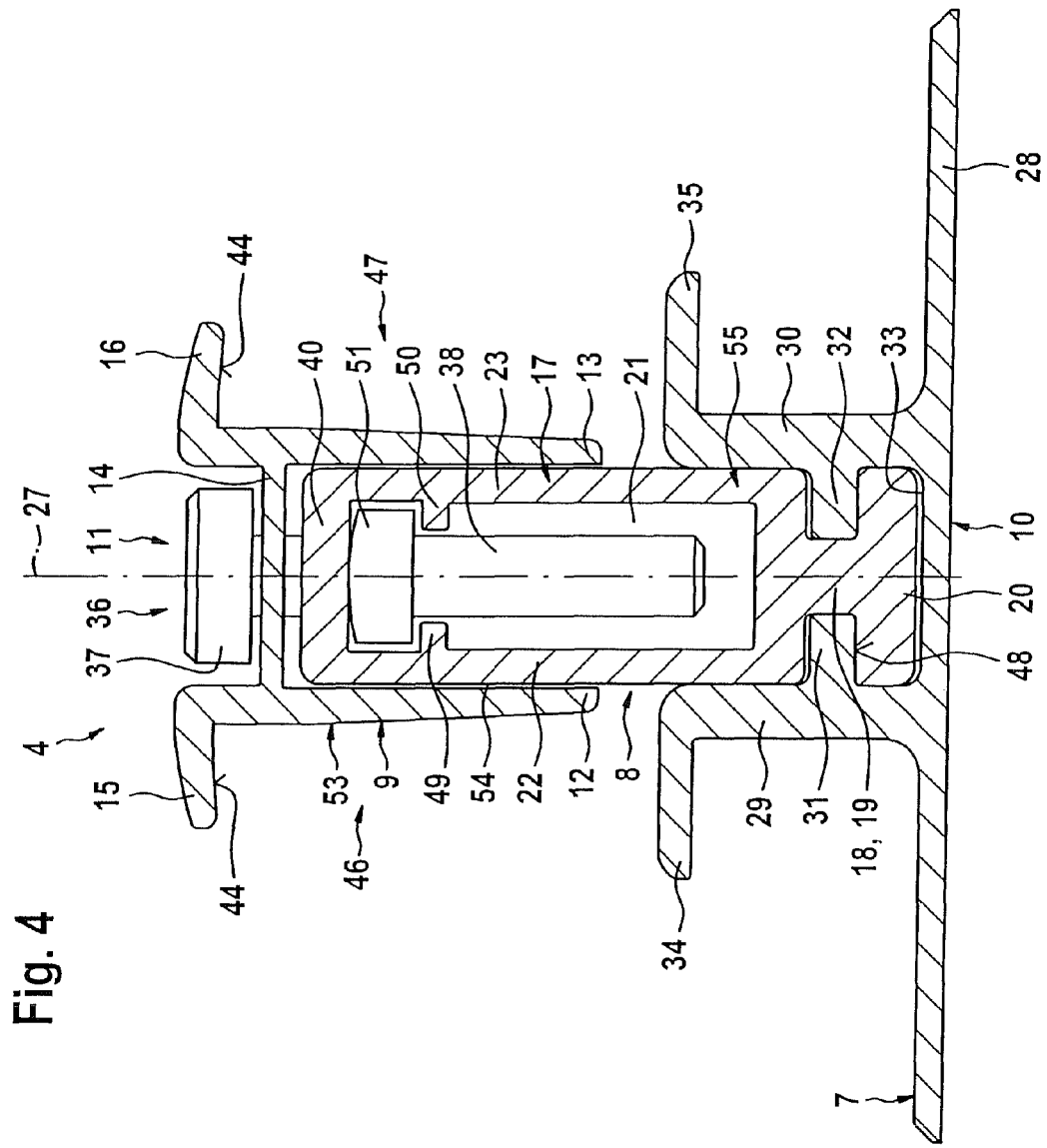
FIG. 4 is a sectional view of the solar module retention unit in accordance with a second exemplary embodiment.
Figure 5:
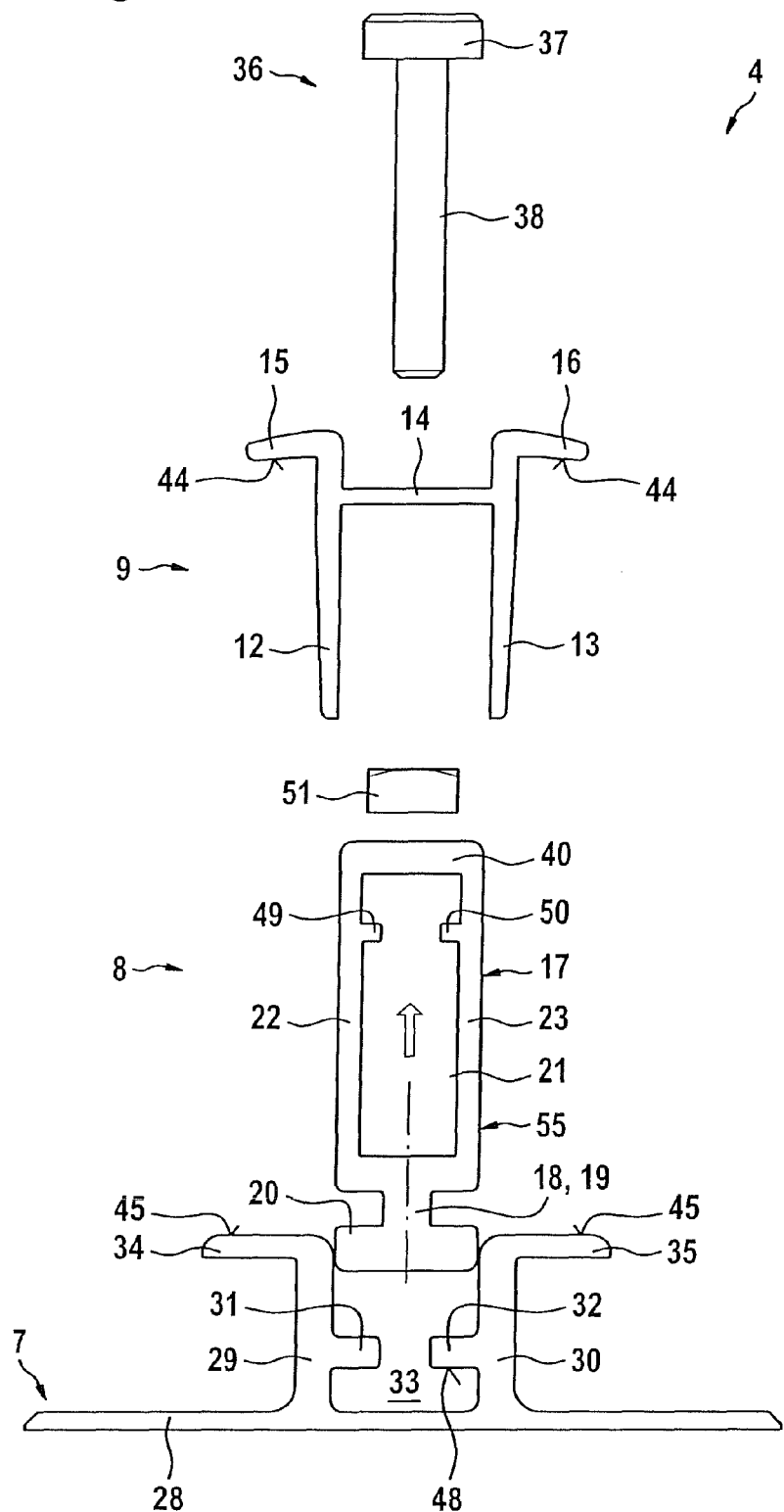
FIG. 5 is an exploded rendering of the solar module retention unit in accordance with FIG. 4.

FIGS. 4 and 5 depict a solar module retention unit 4 in accordance with a second exemplary embodiment, FIG. 4 providing a sectional depiction and FIG. 5 providing an exploded rendering. The majority of the solar module retention unit 4 in accordance with the second exemplary embodiment corresponds to the solar module retention unit 4 in accordance with the first exemplary embodiment (FIGS. 2 and 3); refer to the description for FIGS. 2 and 3. Only the differences will be discussed.

The intermediate element 8 of the solar module retention unit 4 also has a longitudinal channel 21 in accordance with the second exemplary embodiment. The longitudinal channel 21 is delimited on two sides by opposing intermediate element walls 22, 23, and is accessible from the other two sides. A supporting projection 49, 50 is embodied on each of the intermediate element walls 22, 23. The supporting projections 49, 50 oppose one another and project into the longitudinal channel 21. A nut 51 is inserted into the longitudinal channel 21, and the nut 51 is positioned on the supporting projections 49, 50 and is adjacent to the end face 40. The nut 51 has a through-opening with a female thread. The nut 51 is arranged axially essentially non-displaceable in the longitudinal channel 21 and is held rotation-fast between the intermediate element walls 22, 23. If during mounting the threaded screw 36 is screwed further into the female thread of the nut 51, the clamping surface 44 is pressed against the solar module 1 supported on the counter-clamping surface 45 and a clamping force is produced by this.

As stated in the foregoing, FIGS. 6 and 7 depict two possible arrangements of the clamping element 9 on the intermediate element 8 and/or of the slot nut 20 in the receiving element 33. The intermediate element 8 may be an intermediate element 8 in accordance with the first exemplary embodiment having a screw channel 21' or it may be an intermediate element 8 in accordance with the second exemplary embodiment having a nut 51. Due to the symmetrical embodiment of the intermediate element 8 and the clamping element 9 with the two parallel clamping bars 15, 16, there are exactly two different options for arranging the intermediate clamping element 9 on the intermediate element 8. These are rotated 90° to one another. The same is true of the allocation of the slot nut 20 in the receiving element 33. Thus the solar module retention unit 4 may clamp the solar module 1 on one of its lateral sides or on its upper or lower edge.

Since the solar module retention unit 4 is embodied symmetrical, two solar modules 1 that are to be arranged adjacent to one another on the roof may be held by means of one solar module retention unit 4. Naturally it is also possible to use only one of the clamping bars 15, 16 and counter-clamping bars 34, 35 for holding only one solar module 1 that is arranged for instance on the edge of an array of solar modules.

Further areas of applicability will become apparent from the description provided herein. The description and specific examples in this summary are intended for purposes of illustration only and are not intended to limit the scope of the present disclosure.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A solar module retention unit for clamping retention of a solar module, the solar module retention unit comprising:
   a base retention unit attachable at a mounting site the base retention unit defining a counter-clamping surface for engaging the solar module;
   an intermediate element held on the base retention unit and displaceable relative to the base retention unit in a longitudinal direction; and
   a clamping element defining a clamping surface for engaging the solar module and cooperating with the counter-clamping surface of the base retention unit to form a retention clip for capturing the solar module directly between the clamping surface and counter-clamping surface, the counter-clamping surfaces longitudinally fixed with the base retention unit, the clamping surface moveable toward the counter-clamping surface in a clamping direction transverse to the longitudinal direction, the clamping element mechanically linked to the intermediate element by a screw connection having a rotational axis,
   wherein the clamping element is guided on the intermediate element rotation-fast by an anti-rotation element with respect to the rotational axis of the screw connection,
   wherein tightening of the screw connection draws the clamping element downward toward the base retention unit and resultantly draws the intermediate element in an opposite direction to secure the intermediate element relative to the base retention unit,
   wherein the clamping element has two parallel guide walls spaces apart from one another in a lateral direction and between which a section of the intermediate element is laterally received and guided.

2. The solar module retention unit in accordance with claim 1, wherein the clamping element has at least one downwardly extending guide wall that is displaceably guided in the direction of the rotational axis along an area of an outer sectional contour of the intermediate element.

3. The solar module retention unit in accordance with claim 1, wherein an outer sectional contour of both a section of the intermediate element and an extension of the section are square.

4. The solar module retention unit of claim 1, wherein the intermediate element is unitarily formed and has a longitudinal channel in which a threaded screw belonging to a screw connection engages.

5. The solar module retention unit in accordance with claim 4, wherein the longitudinal channel is embodied as a screw channel for the threaded screw.

6. The solar module retention unit in accordance with claim 4, further comprising a nut for the threaded screw is inserted into the longitudinal channel, the intermediate element including first and second element walls and first and second supporting projections inwardly extending from the first and second element walls, respectively, the nut supported on the first and second supporting projections.

7. The solar module retention unit in accordance with claim 6, further comprising at least one supporting projection for axially fixing the nut, the at least one supporting projection disposed in the longitudinal channel.

8. The solar module retention unit in accordance with claim 6, wherein the nut is received in the longitudinal channel in an anti-rotational manner.

9. The solar module retention unit in accordance with claim 1, wherein the clamping element includes first and second guide walls joined to one another by a transverse bar and cooperating to define an H-shape in longitudinal section.

10. The solar module retention unit in accordance with claim 9, wherein the intermediate element has a longitudinal channel in which a threaded screw belonging to a screw connection engages, and further wherein the threaded screw passes through an opening in the transverse bar and is supported with a screw head on the transverse bar for applying a clamping force of the retention clip.

11. The solar module retention unit in accordance with claim 1, wherein the intermediate element is held on the base retention unit of a slot nut connection.

12. Solar module retention unit in accordance with claim 9, wherein the intermediate element has a slot nut that is inserted into a receiving element of the base retention unit and, when a clamping force of the retention clip is applied, is non-displaceably supported on a receiving surface of the receiving element of the base retention unit.

13. The solar module retention unit in accordance with claim 1, wherein the base retention unit has a base plate on which are provided two parallel walls that extend perpendicular to a plane of the base plate and between which the receiving element is embodied by a longitudinal projection on at least one of the walls.

14. The solar module retention unit in accordance with claim 13, wherein the clamping element has two parallel guide walls between which a section of the intermediate element is received and guided, and further wherein an extension of the section of the intermediate element guides and extends towards the longitudinal projection to between the walls of the base retention unit.

15. The solar module retention unit in accordance with claim 14, wherein a slot nut is connected to the extension via a holding rib that forms a neck of the intermediate element, the longitudinal projection delimiting the neck.

16. The solar module retention unit in accordance with claim 12, further comprising a clamping bar having the clamping surface which projects away from the guide wall of the intermediate element and in that a counter-clamping bar having the receiving surface projects away from at least one of the walls of the base retention unit.

17. The solar module retention unit in accordance with claim 1, wherein at least one of the intermediate element, the clamping element, and the base retention unit is an extruded component.

18. The solar module retention unit in accordance with claim 15, wherein at least one of the neck and the slot nut has a square circumferential contour.

19. The solar module retention unit in accordance with claim 1, wherein the clamping element includes a pair of downwardly extending guide walls, the intermediate element received laterally between the downwardly extending guide walls.

20. The solar module retention unit in accordance with claim 1, wherein the clamping element includes a lower end upwardly spaced from the base retention unit.

21. A solar module retention unit for clamping retention of a solar module, the solar module retention unit comprising:
- a base retention unit attachable at a mounting site;
  - a clamping element defining a clamping surface that cooperates with a counter-clamping surface of the base retention unit to form a retention clip for the solar module; and
  - an intermediate element held on the base retention unit and displaceable transverse to a clamping direction of the retention clip, the clamping element being mechanically linked to the intermediate element by a screw connection having a rotational axis,
- wherein in a lateral section the intermediate element is elongated in a vertical direction, a lower portion of the intermediate element slidably received by the base retention unit, an upper portion of the intermediate element received between a pair of downwardly extending guide walls,
- wherein the clamping element includes first and second guide walls connected by a transverse bar, the first and second guide walls and the transverse bar cooperating to define an H-shape in a longitudinal section, the clamping element further including first and second clamp bars projecting from the first and second guide walls, respectively, in opposite directions, a lower side of both of the first and second clamp bars defining clamping surfaces for engaging the solar module.

22. The solar module retention unit in accordance with claim 21, wherein the clamping element is vertically spaced from the base retention unit.

23. A solar module retention unit for clamping retention of a solar module, the solar module retention unit comprising:
- a clamping element having first and second guide walls connected by a transverse bar, the first and second guide walls and the transverse bar cooperating to define an H-shape in a longitudinal section, the clamping element further including first and second clamp bars projecting from the first and second guide walls, respectively, in opposite directions, a lower side of both of the first and second clamp bars defining clamping surfaces for engaging the solar module;
- a base retention unit including first and second parallel walls and first and second counter-clamping bars extending from the first and second parallel walls, respectively, and defining counter-clamping surfaces for engaging the solar module;
- an intermediate member extending between the clamping element and the base retention unit such that the clamping element and the base retention unit are spaced apart from one another in a first direction, the intermediate element including a lower end slidably received by the base retention unit for sliding in a second direction perpendicular to the first direction, the intermediate element further having an upper end received between the first and second guide walls of the clamping element;
- a screw connection for drawing the clamping element toward the base retention unit and resultantly drawing the intermediate element in an opposite direction to secure the intermediate element relative to the base retention unit.

24. The solar module retention unit in accordance with claim 23, wherein the lower end of the intermediate member has a T-shape in the longitudinal section and the upper end of the intermediate member has an open rectangular shape in the longitudinal section.

\* \* \* \* \*